US006149792A

United States Patent [19]

Chakravorty

[11] Patent Number: 6,149,792

[45] Date of Patent: Nov. 21, 2000

[54] ROW ELECTRODE ANODIZATION

[75] Inventor: Kishore K. Chakravorty, San Jose, Calif.

[73] Assignee: Candescent Technologies Corporation, San Jose, Calif.

[21] Appl. No.: 08/940,706

[22] Filed: Sep. 30, 1997

[51] Int. Cl.[7] .......................... C25D 5/02; H01L 21/288; H01L 21/445

[52] U.S. Cl. .......................... 205/124; 205/324; 205/325; 205/121

[58] Field of Search .................................... 205/124, 324, 205/325, 201, 121; 313/309, 336

[56] References Cited

U.S. PATENT DOCUMENTS

| | | | |
|---|---|---|---|
| 5,243,252 | 9/1993 | Kaneko et al. | 313/309 |
| 5,397,957 | 3/1995 | Zimmerman | 313/309 |
| 5,498,925 | 3/1996 | Bell et al. | 313/497 |
| 5,591,352 | 1/1997 | Peng | 216/11 |
| 5,643,817 | 7/1997 | Kim et al. | 437/51 |
| 5,731,216 | 3/1998 | Holmberg et al. | 438/30 |

*Primary Examiner*—Kathryn Gorgos
*Assistant Examiner*—Wesley A. Nicolas
*Attorney, Agent, or Firm*—Wagner, Murabito & Hao LLP

[57] ABSTRACT

A structure and method for forming an anodized row electrode for a field emission display device. In one embodiment, the present invention comprises depositing a resistor layer over portions of a row electrode. Next, an inter-metal dielectric layer is deposited over the row electrode. In the present embodiment, the inter-metal dielectric layer deposited over portions of the resistor layer and over pad areas of the row electrode. After the deposition of the inter-metal dielectric layer, the row electrode is subjected to an anodization process such that exposed regions of the row electrode are anodized. In so doing, the present invention provides a row electrode structure which is resistant to row to column electrode shorts and which is protected from subsequent processing steps.

7 Claims, 6 Drawing Sheets

ROW ELECTRODE ANODIZATION

FIELD OF THE INVENTION

The present claimed invention relates to the field of flat panel displays. More particularly, the present claimed invention relates to the formation of a row electrode for a flat panel display screen structure.

BACKGROUND ART

Field emission display devices are typically comprised of numerous layers. The layer are formed or deposited using various fabrication process steps. Prior Art FIG. 1A is a schematic side sectional view of a portion of a pristine conventional field emission display structure. More specifically, Prior Art FIG. 1A illustrates a row electrode layer 100 having an overlying resistive layer 102 and an overlying inter-metal dielectric layer 104. Field emitter structures, typically shown as 106*a* and 106*b*, are shown disposed within cavities formed into inter-metal dielectric layer 104. A column electrode 108 is shown disposed above inter-metal dielectric layer 104. As mentioned above, Prior Art FIG. 1 schematically illustrates a portion of a pristine conventional field emission display structure. However, conventional field emission display structures are typically not pristine. That is, manufacturing and fabrication process variations often result in the formation of a field emission display structure containing significant defects.

With reference next to Prior Art FIG. 1B, a side sectional view of a portion of a defect-containing field emission display structure is shown. During the fabrication of conventional field emission display structures, the aforementioned layers are often subjected to caustic or otherwise deleterious substances. Specifically, during the fabrication of various overlying layers, row electrode layer 100 is often subjected to processes which adversely affect the integrity row electrode 100. As shown in the embodiment of Prior Art FIG. 1B, certain fabrication process steps can deleteriously etch or corrode row electrode 100. In fact, some conventional fabrication processes can result in the complete removal of at least portions of row electrode 100. Such degradation of row electrode 100 can render the field emission display device defective and even inoperative.

With reference next to Prior Art FIG. 1C, a side sectional view of a portion of another defect containing field emission display structure is shown. In addition to unwanted corrosion or etching of the row electrode, other defects can occur which degrade or render the field emission display structure inoperable. In the embodiment of Prior Art FIG. 1C, feature 110 represents a “short” extending between row electrode 100 and column electrode 108. Such shorting can occur in a conventional field emission display device when the row electrode is not properly insulated from the gate electrode. That is, if a region on the conductive surface of the row electrode is exposed and, therefore, not properly insulated from the gate electrode, shorting to the gate electrode can occur. Portions of the row electrode may remain exposed when deposition of various layers over the row electrode is not consistent or complete, or when the layers are degraded (e.g. etched or corroded) by subsequent process steps. The inconsistent deposition or degradation of the layers between the row electrode and the column electrode can result in the existence of non-insulative paths which extend from the row electrode to the column electrode. Such a short can render the field emission display device defective and even inoperative. All of the above-described defects result in decreased field emission display device reliability and yield.

Thus, a need exists for a row electrode structure and row electrode formation method which is less susceptible to damage during subsequent process steps utilized during the fabrication of a field emission display device. A further need exists for a row electrode structure and row electrode formation method for use in a field emission display device wherein the row electrode reduces the occurrence of row to column shorts. Still another need exists for a row electrode and row electrode formation method which improves reliability and yield.

SUMMARY OF INVENTION

The present invention provides a row electrode structure and row electrode formation method which is less susceptible to damage during subsequent process steps utilized during the fabrication of the field emission display device. The present invention also provides a row electrode structure and row electrode formation method for use in a field emission display device wherein the row electrode reduces the occurrence of row to column shorts. The present invention further provides a row electrode and row electrode formation method which improves reliability and yield.

Specifically, in one embodiment, a structure and method for forming an anodized row electrode for a field emission display device is disclosed. In this embodiment, the present invention comprises depositing a resistor layer over portions of a row electrode. Next, an inter-metal dielectric layer is deposited over the row electrode. In the present embodiment, the inter-metal dielectric layer is deposited over portions of the resistor layer and over pad areas of the row electrode. After the deposition of the inter-metal dielectric layer, the row electrode is subjected to an anodization process such that exposed or inadvertently uncovered regions of the row electrode are anodized. In so doing, the present invention provides a row electrode structure which is resistant to row to column electrode shorts and which is protected from subsequent processing steps.

In another embodiment, the present invention provides an anodized row electrode and formation method. In this embodiment, the present invention masks the row electrode such that first regions of the row electrode are masked and such that second regions of the row electrode are not masked. Next, the present invention subjects the row electrode to an anodization process such that the first regions of the row electrode are not anodized and such that second regions of the row electrode are anodized. In the present embodiment, the first regions of the row electrode include pad areas and/or sub pixel areas of the row electrode.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

Prior Art

The drawings referred to in this description should be understood as not being drawn to scale except if specifically noted.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
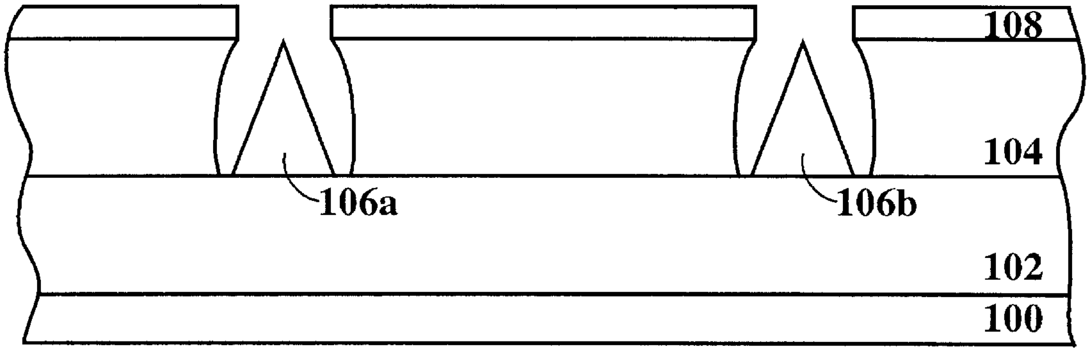
FIG. 1A (Prior Art)
FIG. 1A is a side sectional view illustrating a pristine conventional field emission display structure.
Figure 1B:
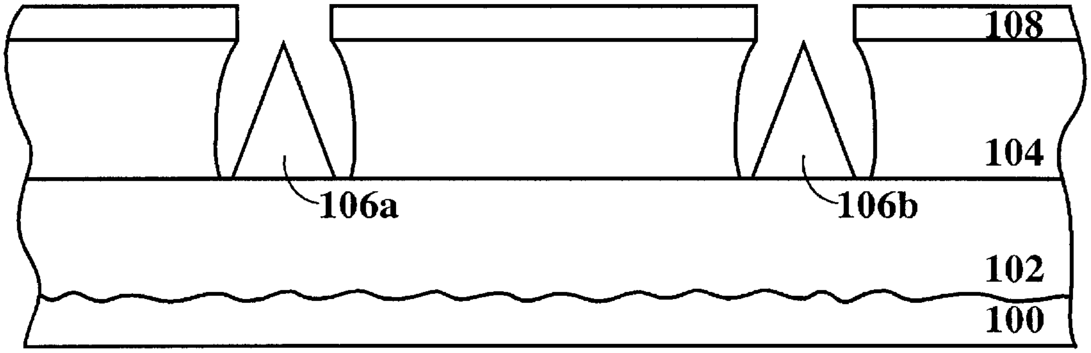
FIG. 1B (Prior Art)
FIG. 1B is a side sectional view illustrating a defect-containing conventional field emission display structure.
Figure 1C:
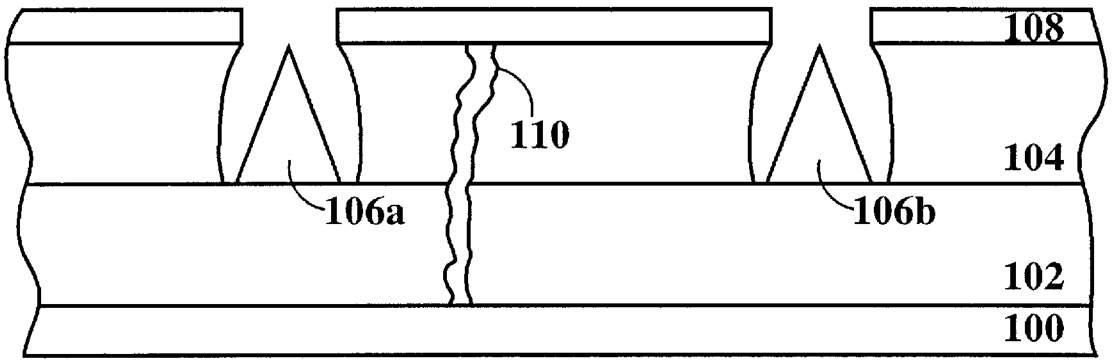
FIG. 1C (Prior Art)
FIG. 1C is a side sectional view illustrating another defect-containing conventional field emission display structure.
Figure 2:
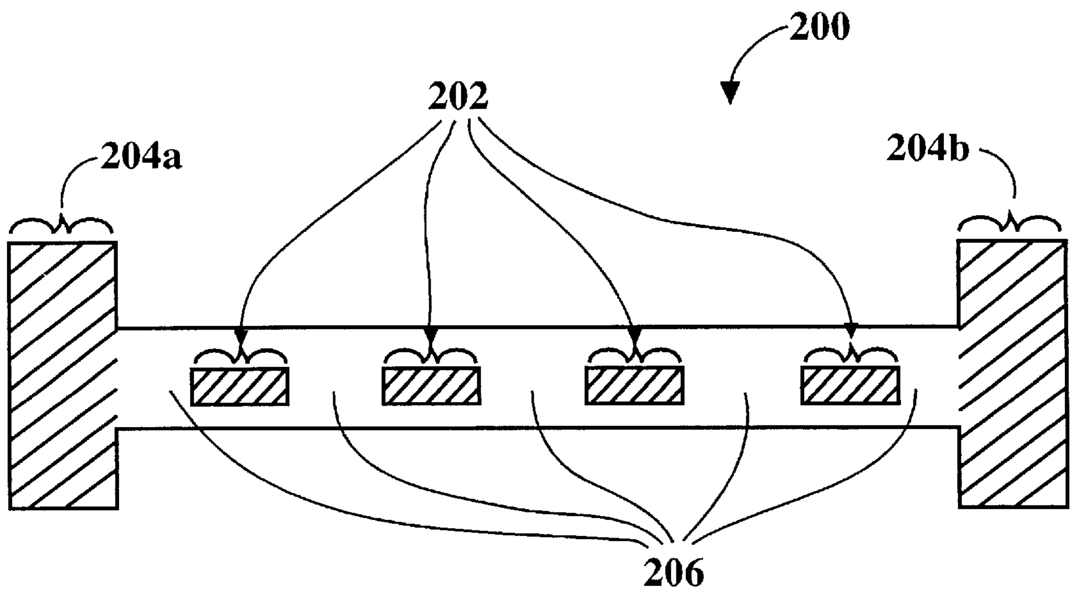
FIG. 2 is a top plan view of a selectively masked row electrode in accordance with the present claimed invention.

With reference now to FIG. 2, a top plan view of a masked row electrode 200 is shown in accordance with the present claimed invention. In the present embodiment, the row electrode is formed by depositing a conductive layer of material and patterning the conductive layer of material to form row electrode 200. In the present embodiment, row electrode 200 is formed of aluminum. The present invention is also well suited however, to use with a row electrode which is comprised of more than one type of conductive material. For example, in another embodiment of the present invention, row electrode 200 is comprised of aluminum having a top surface clad with tantalum. In yet another embodiment of the present invention, row electrode 200 is comprised of aluminum having a top surface and side surfaces clad with tantalum. Although such a row electrode formation method is described in conjunction with the present embodiment, the present invention is well suited to use with row electrodes formed using various other row electrode formation techniques or methods. In the following discussion, only a single row electrode 200 is shown and described for purposes of clarity. It will be understood, however, that the present invention is well suited to implementation with an array of such row electrodes.

With reference still to FIG. 2, in the present embodiment, row electrode 200 is selectively masked such that first regions 202, 204*a,* and 204*b* of row electrode 200 are masked, and such that second regions 206 of row electrode 200 are not masked. More specifically, in the present invention, the first masked regions are those surface areas of row electrode 200 which need to be conductive. For example, in the present embodiment, masked first regions 202 are sub-pixel areas of row electrode 200. That is, masked first regions 202 correspond to locations on row electrode which will be aligned with sub-pixel regions on the faceplate of the field emission display structure. Additionally, in this embodiment, masked first regions 204*a* and 204*b* are pad areas of row electrode 200. The pad areas are used to couple row electrode 200 to a current source. The unmasked second regions 206 are those surface areas of row electrode 200 which do not need to be conductive for the field emission display device to function properly. In the present embodiment, the unmasked second regions 206 are comprised all the exposed surfaces of row electrode which are neither sub-pixel areas nor pad areas. With reference still to FIG. 2, in the present embodiment, the selective masking of row electrode 200 is accomplished using an anodization photo mask. It will be understood, however, that selective masking of row electrode 200 can be accomplished using various other mask types and masking methods.

Figure 3:
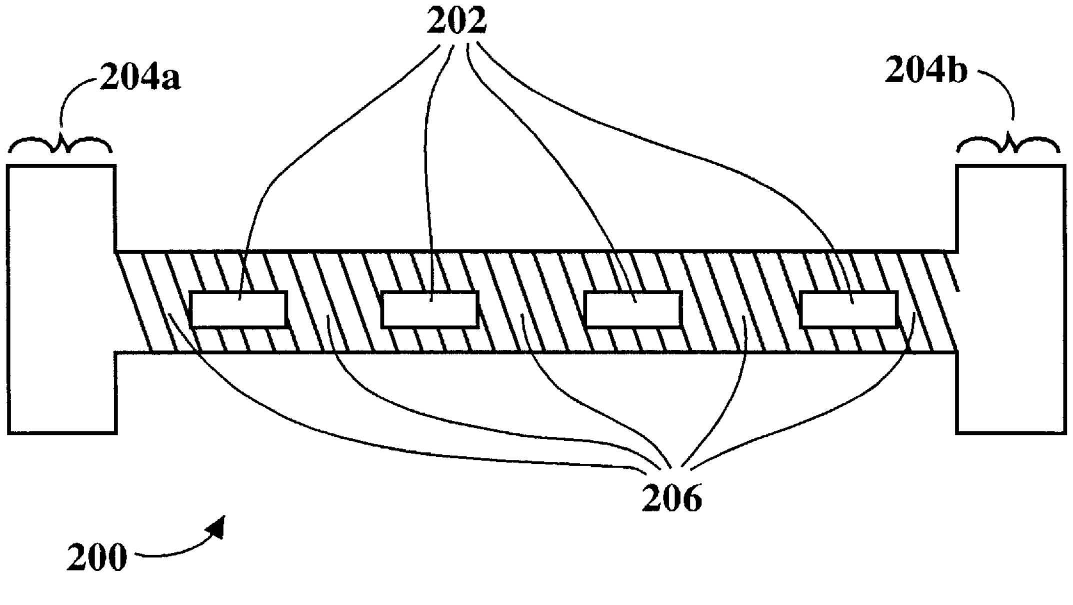
FIG. 3 is a top plan view of a row electrode which has been selectively anodized in accordance with the present claimed invention.

Referring next to FIG. 3, a top plan view of row electrode 200 of FIG. 2 is shown after subjecting row electrode to an anodization process in accordance with the present claimed invention. In the present invention, selectively masked row electrode 200 is subjected to an anodization process using, for example, a citric acid solution to accomplish the anodization process. In so doing, row electrode 200 is thereby anodized at the unmasked regions 206, and is not anodized at regions 202, 204*a,* and 204*b*. Thus, those surface areas of row electrode 200 which need to be conductive (e.g. sub-pixel and pad areas) are not anodized, and those surface areas of row electrode 200 which do not need to be conductive (e.g. areas other than sub-pixel and pad areas) are anodized. By selectively anodizing row electrode 200, the present invention provides a row electrode structure 200 which is less susceptible to damage during subsequent process steps utilized during the fabrication of the field emission display device. Thus, large portions (i.e. anodized areas 206 of row electrode 200) are protectively coated and thereby guarded from harmful agents which could otherwise etch/corrode row electrode 200 during subsequent fabrication of a field emitter display device.

As yet another benefit, because the surface of row electrode 200 is not highly conductive at anodized portions 206, electron emission from these areas is highly reduced. As a result, row to column shorts are minimized by the present anodization invention. By reducing such row to column shorts, the present invention provides a row electrode and a row electrode formation method, which improves reliability and yield.

Figure 4:
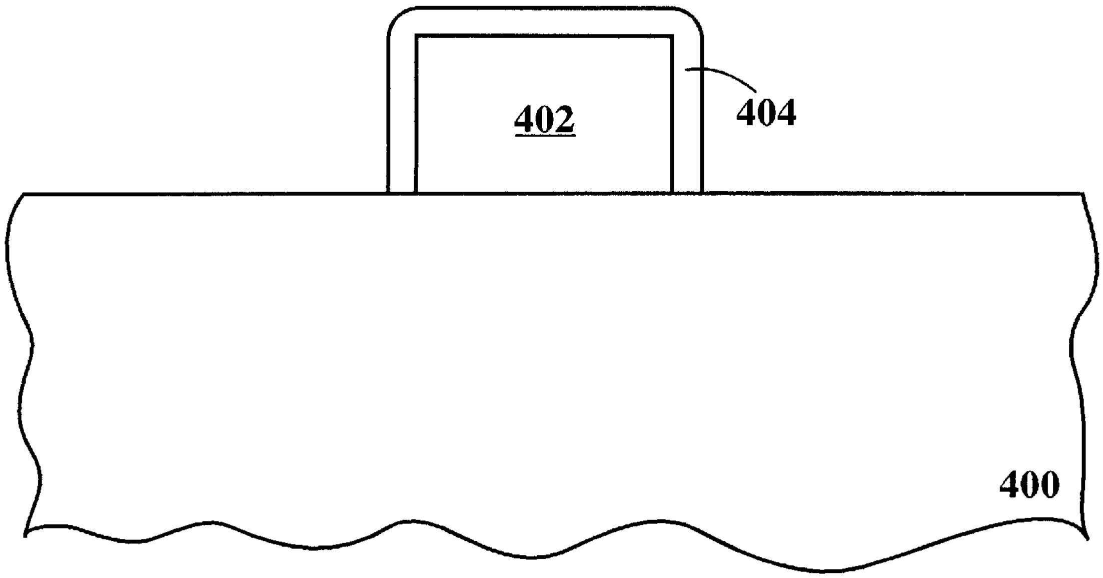
FIG. 4 is a side sectional view of an anodized row electrode in accordance with the present claimed invention.

With reference next to FIG. 4, a side sectional view of a row electrode anodized in accordance with the present invention is shown. In the embodiment of FIG. 4, a substrate 400 has a row electrode 402 formed thereon. In this embodiment, row electrode 402 is comprised of a conductive material such as, for example, aluminum. The present embodiment subjects aluminum row electrode 402 to an anodization process using, for example, a citric acid solution to accomplish the anodization process. In so doing, aluminum row electrode 402 is coated by a layer of $Al_2O_3$ 404. Although $Al_2O_3$ is specifically mentioned in the present embodiment, the present invention is well suited to the use of various other stoichiometries. That is, the present invention is well suited to forming an anodized coating comprised of $Al_xO_y$.

Figure 5:
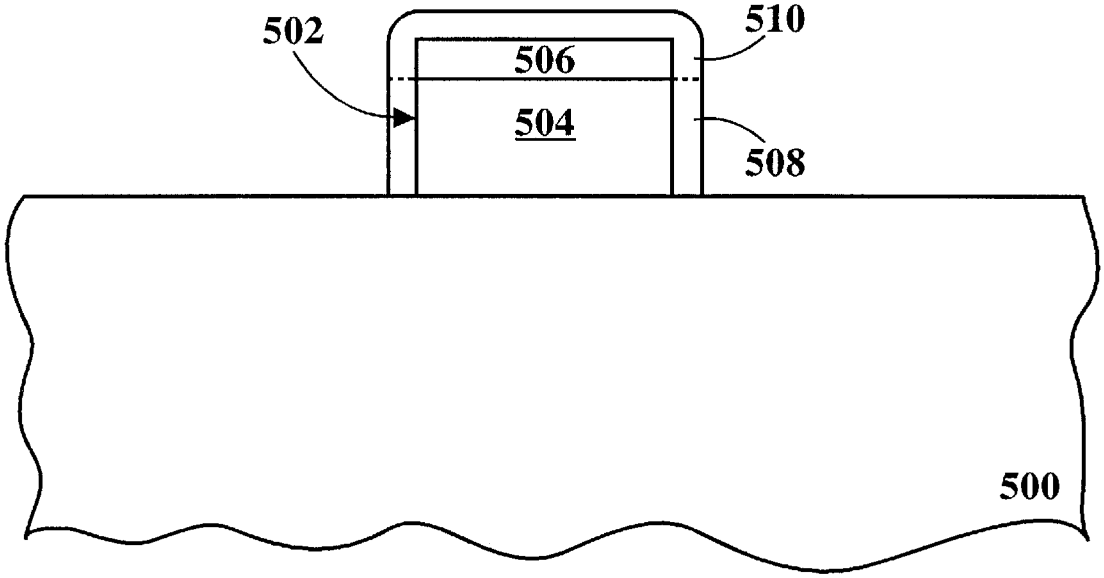
FIG. 5 is a side sectional view of a tantalum-clad anodized row electrode in accordance with the present claimed invention.

With reference next to FIG. 5, a side sectional view of another embodiment of a row electrode anodized in accordance with the present invention is shown. In the embodiment of FIG. 5, a substrate 500 has a row electrode 502 formed thereon. In this embodiment, row electrode 502 is comprised of a conductive material 504 such as, for example, aluminum, having a top surface 506 clad with another conductive material such as, for example, tantalum. The present embodiment subjects tantalum-clad aluminum row electrode 502 to an anodization process using, for example, a citric acid solution to accomplish the anodization process. In so doing, the exposed aluminum portions of row electrode 502 (e.g. the lower side portions of row electrode 502) are coated by a layer of $Al_2O_3$ 508. After the anodization process of the present invention, the tantalum-clad portions of row electrode 502 (e.g. the top surface 506 of row electrode 502) are coated with $Ta_2O_5$ 510. As mentioned previously, row electrode 502 is subjected to the above-described anodization process at those surface areas of row electrode 502 which do not need to be conductive (e.g. areas other than sub-pixel and pad areas). Additionally, in this embodiment of the present invention, in which the row electrode has exposed regions of both aluminum and tantalum, anodization of the aluminum and the tantalum is achieved concurrently.

Figure 6:
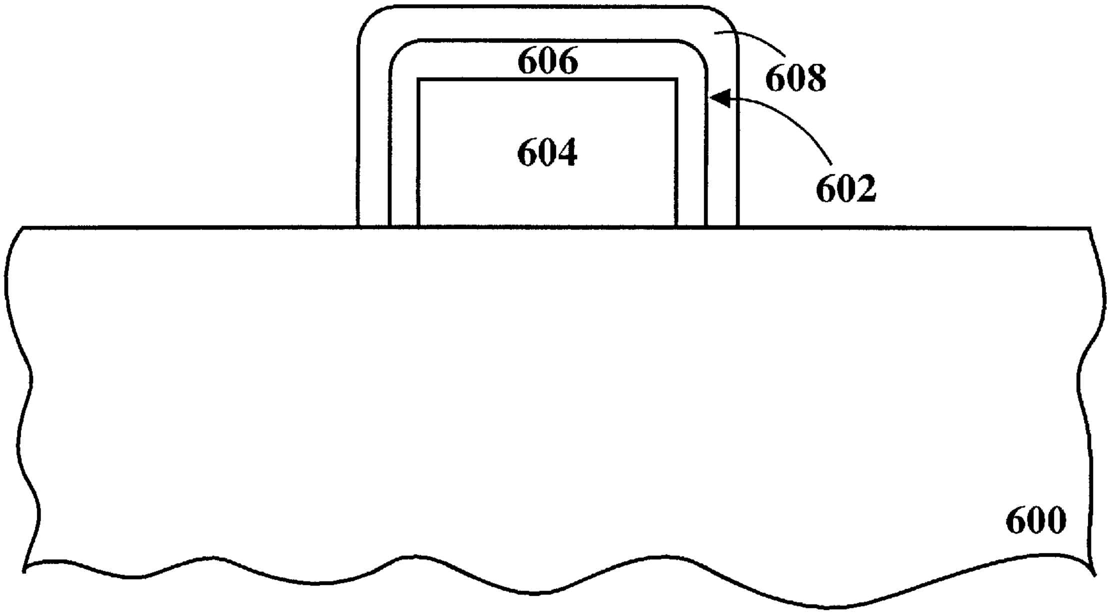
FIG. 6 is a side sectional view of a tantalum-coated anodized row electrode in accordance with the present claimed invention.

With reference next to FIG. 6, a side sectional view of yet another embodiment of a row electrode anodized in accordance with the present invention is shown. In the embodiment of FIG. 6, a substrate 600 has a row electrode 602 formed thereon. In this embodiment, row electrode 602 is comprised of a conductive material such as, for example, aluminum 604, completely covered with another conductive material such as, for example, tantalum 606. The present embodiment subjects the tantalum-covered aluminum row electrode 602 to an anodization process using, for example, a citric acid solution to accomplish the anodization process. In so doing, tantalum-covered row electrode 602 is coated with $Ta_2O_5$ 608. Although $Ta_2O_5$ is specifically mentioned in the present embodiment, the present invention is well suited to the use of various other stoichiometries. That is, the present invention is well suited to forming an anodized coating comprised of $Ta_xO_y$. As mentioned previously, tantalum-covered row electrode 602 is subjected to the above-described anodization process at those surface areas of tantalum-covered row electrode 602 which do not need to be conductive (e.g. areas other than sub-pixel and pad areas). The present embodiment also includes a substantial benefit. Specifically, in such an embodiment, it is possible to subject tantalum-covered row electrode 602 to the anodization process without first masking those surface areas of tantalum-covered row electrode 602 which need to be conductive (e.g. sub-pixel and pad areas). That is, because the row electrode is completely clad with tantalum, only $Ta_2O_5$ is formed by the anodization process. Unlike $Al_2O_3$, $Ta_2O_5$ can be easily removed from the surface of the row electrode. Therefore, in such an embodiment, the entire surface of the tantalum-covered row electrode is anodized, and the $Ta_2O_5$ is simply removed from, for example, the sub-pixel and pad areas. Thus, in such an embodiment, the present invention does not require an extensive anodization masking step prior to subjecting the tantalum-covered row electrode to the anodization process.

Figure 7A:
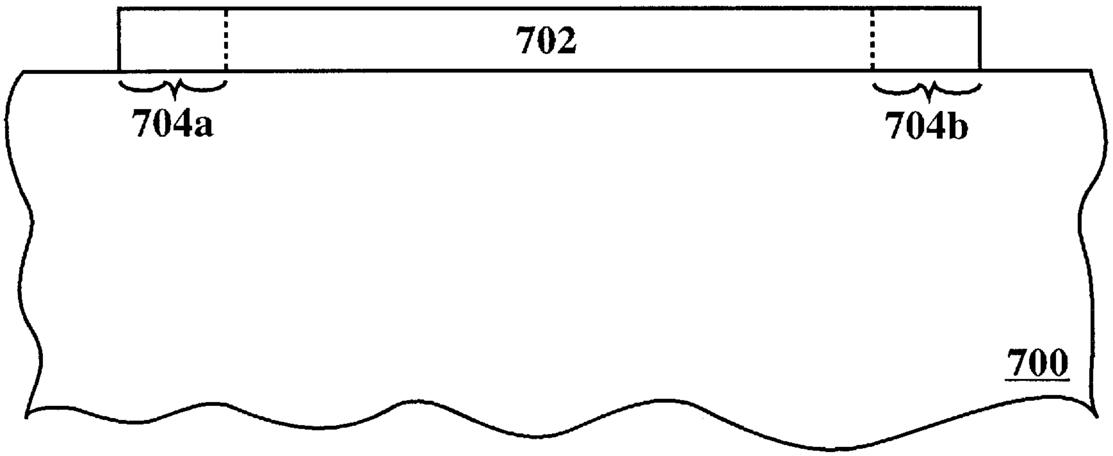
FIG. 7A is a side sectional view of a row electrode prior to being subjected to an anodization masking process in accordance with the present claimed invention.

Referring next to FIG. 7A, a side sectional view of a row electrode is shown. In the present embodiment, a substrate 700 has row electrode 702 formed thereon. Row electrode 702 of FIG. 7A also includes pad regions 704*a* and 704*b*. In this embodiment, row electrode 702 is formed of a conductive material such as, for example, aluminum. Although such a row electrode structure is recited in the present embodiment, the present invention is also well suited to an embodiment in which the row electrode structure is comprised of a combination of materials. Such a combination of materials includes, for example, an aluminum row electrode which is partially clad with tantalum, an aluminum electrode which is entirely covered with tantalum, and the like.

Figure 7B:
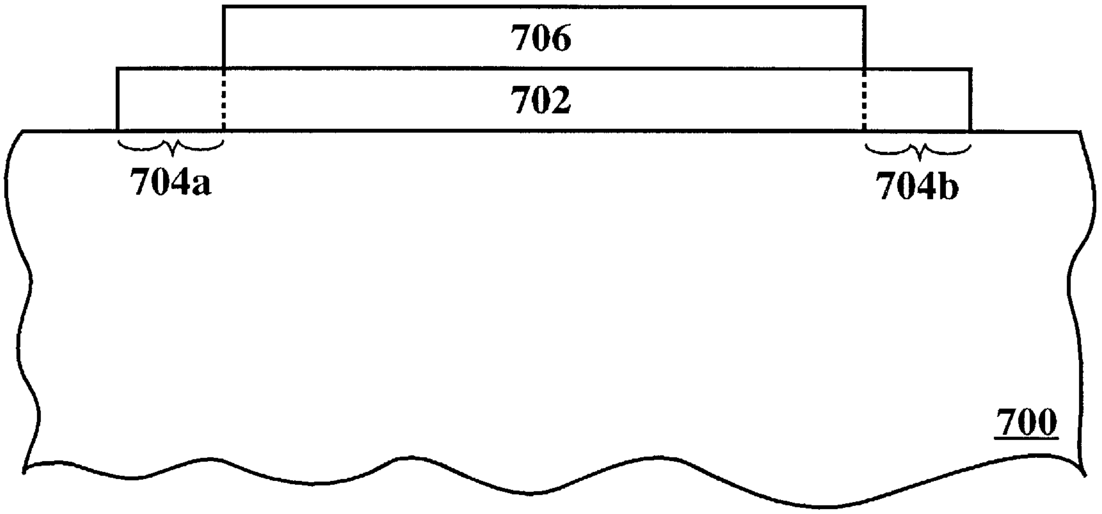
FIG. 7B is a side sectional view of a row electrode during a first step of an anodization masking process in accordance with the present claimed invention.

Referring next to FIG. 7B, the present embodiment then deposits a resistor layer 706 over portions of row electrode 702. As shown in the embodiment of FIG. 7B, resistor layer 706 is deposited over row electrode 702 except for pad areas 704*a* and 704*b*. In the present embodiment, resistor layer 706 is formed of silicon carbide (SiC), Cermet, or a dual layer combination. Although the deposition of a resistor layer is recited in the present embodiment, the present invention is also well suited to an embodiment in which a resistor layer is not disposed directly on top of row electrode 702.

Figure 7C:
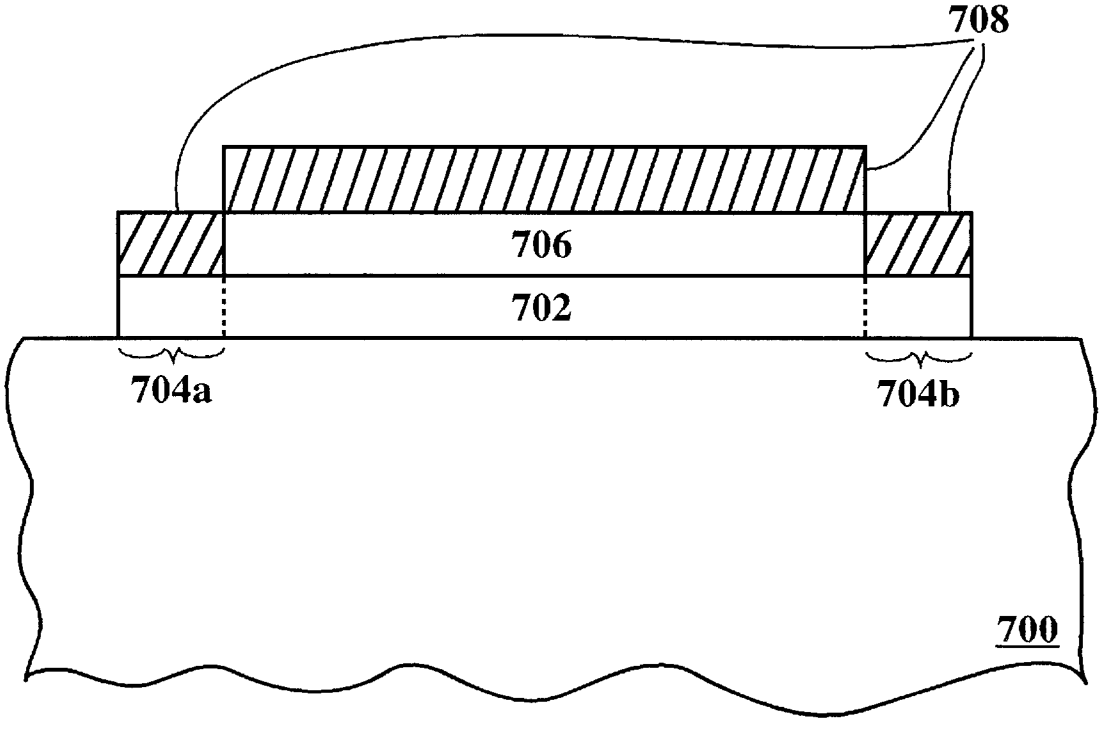
FIG. 7C is a side sectional view of a row electrode during a second step of an anodization masking process in accordance with the present claimed invention.

Referring next to FIG. 7C, the present embodiment then deposits an inter-metal dielectric layer 708 over resistor layer 706 and row electrode 702. As shown in FIG. 7C, inter-metal dielectric layer 708 is deposited over the entire surface of row electrode 702, including pad areas 704*a* and 704*b*. Furthermore, in the present embodiment, inter-metal dielectric layer 708 is comprised of a non-conductive material such as, for example, silicon dioxide ($SiO_2$). In the present embodiment, the deposition of inter-metal dielectric layer 708 is accomplished using a standard inter-metal deposition mask which has been modified slightly to provide for deposition of the inter-metal dielectric material onto pad areas 704*a* and 704*b* of row electrode 702. It will be understood, however, that the deposition of the inter-metal dielectric material can be accomplished using various other mask types and masking methods.

Referring still to FIG. 7C, as mentioned above, defects can occur which degrade or render the field emission display structure inoperable. For example, portions of the row electrode may remain exposed when deposition of various layers over the row electrode is not consistent or complete, or when the layers are degraded (e.g. etched or corroded) by subsequent process steps. That is, portions of row electrode 702 may still remain exposed even after deposition of resistor layer 706 and after deposition of inter-metal dielectric layer 708. The inconsistent deposition or degradation of the layers between the row electrode and the column electrode can result in the existence of non-insulative paths which extend from the row electrode to the column electrode. Such a short can render the field emission display device defective and even inoperative. All of the above-described defects result in decreased field emission display device reliability and yield. The present embodiment prevents such defects in the following manner. The present invention subjects resistor and inter-metal dielectric covered row electrode 702 to an anodization process. By subjecting resistor and inter-metal dielectric layer covered row electrode 702 to the anodization process, any exposed portion of row electrode 702 is advantageously anodized. In the present embodiment, the anodization process is performed through inter-metal dielectric layer 708 and resistor layer 706. As a result, any exposed portions of aluminum row electrode 702 will have a layer of $Al_2O_3$ formed thereon. It will be understood that the anodization process could result in the formation of various other coatings such as, for example, $Ta_2O_5$ if the row electrode is clad or covered with tantalum. It will be understood, however, that in the present embodiment, the electrolyte used to anodize the exposed portions of the row electrode must be selected such that it does not attack the resistor or inter-metal dielectric layer.

Thus, the present invention provides a row electrode structure and row electrode formation method which is less susceptible to damage during subsequent process steps utilized during the fabrication of the field emission display device. The present invention also provides a row electrode structure and row electrode formation method for use in a field emission display device wherein the row electrode reduces the occurrence of row to column shorts. The present invention further provides a row electrode and row electrode formation method which improves reliability and yield.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications suited to the particular use contemplated. It is intended that the scope of the invention be defined by the claims appended hereto and their equivalents.

What is claimed is:

1. In a field emission display device, a method for protectively processing a row electrode comprising the steps of:

a) depositing a resistor layer of an electrode portion of a field emission display device over portions of said row electrode of said electrode portion of said field emission display device, b) depositing an inter-metal dielectric layer of an electrode portion of a field emission display device over said row electrode, said inter-metal dielectric layer deposited over portions of said resistor layer and over pad areas of said row electrode; and c) subjecting said row electrode, having said resistor layer and said inter-metal dielectric layer disposed thereover, to an anodization process such that exposed regions of said row electrode are anodized.

2. The method for protectively processing a row electrode in a field emission display device as recited in claim 1 wherein said row electrode is comprised of aluminum.

3. The method for protectively processing a row electrode in a field emission display device as recited in claim 1 wherein said row electrode is comprised of aluminum having a top surface clad with tantalum.

4. The method for protectively processing a row electrode in a field emission display device as recited in claim 1 wherein said row electrode is comprised of aluminum having a top surface and side surfaces clad with tantalum.

5. The method for protectively processing a row electrode in a field emission display device as recited in claim 2 wherein said anodization process of step c) forms an $Al_xO_y$ coating on said exposed regions of said row electrode.

6. The method for protectively processing a row electrode in a field emission display device as recited in claim 3 wherein said anodization process of step c) forms a $Ta_xO_y$ coating on said top surface of said row electrode clad with tantalum at said exposed regions of said row electrode and an $Al_xO_y$ coating on side surfaces of said row electrode at said exposed regions of said row electrode.

7. The method for protectively processing a row electrode in a field emission display device as recited in claim 4 wherein said anodization process of step c) forms a $Ta_xO_y$ coating on said top surface and said side surfaces of said row electrode clad with tantalum at said exposed regions of said row electrode.

* * * * *